United States Patent
Yang et al.

(10) Patent No.: US 9,620,395 B2
(45) Date of Patent: *Apr. 11, 2017

(54) APPARATUS FOR PROCESSING SUBSTRATE FOR SUPPLYING REACTION GAS HAVING PHASE DIFFERENCE

(71) Applicant: EUGENE TECHNOLOGY CO., LTD., Gyeonggi-do (KR)

(72) Inventors: Il-Kwang Yang, Gyeonggi-do (KR); Sung-Tae Je, Gyeonggi-do (KR); Byoung-Gyu Song, Gyeonggi-do (KR); Yong-Ki Kim, Chungcheongnam-do (KR); Kyong-Hun Kim, Gyeonggi-do (KR); Yang-Sik Shin, Gyeonggi-do (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 425 days.

This patent is subject to a terminal disclaimer.

(21) Appl. No.: 14/357,628

(22) PCT Filed: Nov. 16, 2012

(86) PCT No.: PCT/KR2012/009723
§ 371 (c)(1),
(2) Date: May 12, 2014

(87) PCT Pub. No.: WO2013/073886
PCT Pub. Date: May 23, 2013

(65) Prior Publication Data
US 2014/0345801 A1    Nov. 27, 2014

(30) Foreign Application Priority Data
Nov. 17, 2011 (KR) .......... 10-2011-0120256

(51) Int. Cl.
*H01L 21/67* (2006.01)
*C23C 16/44* (2006.01)
(Continued)

(52) U.S. Cl.
CPC .... *H01L 21/67069* (2013.01); *C23C 16/4412* (2013.01); *C23C 16/4587* (2013.01);
(Continued)

(58) Field of Classification Search
CPC ......... H01L 21/67069; H01L 21/67017; H01L 21/67109; H01L 21/67757;
(Continued)

(56) References Cited

U.S. PATENT DOCUMENTS 4,264,393 A * 4/1981 Gorin .................... C23C 16/509
                                                    118/620
4,565,157 A * 1/1986 Brors ...................... C23C 16/42
                                                    118/719
(Continued)

FOREIGN PATENT DOCUMENTS

| KR | 10-0264208 B1 | 9/2000 |
| KR | 10-0431657 B1 | 5/2004 |
| KR | 10-1003305 B1 | 12/2010 |

Primary Examiner — Rudy Zervigon
(74) Attorney, Agent, or Firm — Rabin & Berdo, P.C.

(57) ABSTRACT

Provided is a substrate processing apparatus. The substrate processing apparatus in which processes with respect to substrates are performed includes a lower chamber having an opened upper side, the lower chamber including a passage allowing the substrates to pass therethrough in a side thereof, an external reaction tube closing the opened upper side of the lower chamber to provide a process space in which the processes are performed, a substrate holder on which the one ore more substrates are vertically stacked, the substrate holder being movable between a stacking position in which the substrates are stacked within the substrate holder and a process position in which the processes with (Continued)

respect to the substrates are performed, and a gas supply unit disposed inside the external reaction tube to supply a reaction gas into the process space, the gas supply unit forming a flow of the reaction gas having different phase differences in a vertical direction.

11 Claims, 11 Drawing Sheets

(51) Int. Cl.
- C23C 16/455 (2006.01)
- C23C 16/458 (2006.01)
- H01L 21/677 (2006.01)
- C30B 35/00 (2006.01)
- H01L 21/02 (2006.01)

(52) U.S. Cl.
CPC .. *C23C 16/45517* (2013.01); *C23C 16/45563* (2013.01); *C30B 35/00* (2013.01); *H01L 21/67017* (2013.01); *H01L 21/67109* (2013.01); *H01L 21/67757* (2013.01); *H01L 21/0262* (2013.01); *H01L 21/02532* (2013.01); *H01L 21/02661* (2013.01)

(58) Field of Classification Search
CPC ........... H01L 21/02661; H01L 21/0262; H01L 21/02532; C30B 35/00; C23C 16/45563; C23C 16/4412; C23C 16/4587; C23C 16/45517
USPC ........................................ 118/715; 156/345.1
See application file for complete search history.

(56) References Cited

U.S. PATENT DOCUMENTS

| | | | | |
|---|---|---|---|---|
| 5,164,012 A * | 11/1992 | Hattori | C23C 16/24 | 118/715 |
| 5,433,785 A * | 7/1995 | Saito | C23C 16/4401 | 118/719 |
| 5,540,772 A * | 7/1996 | McMillan | B05D 1/00 | 118/319 |
| 5,551,982 A * | 9/1996 | Anderson | C23C 16/455 | 118/715 |
| 5,614,252 A * | 3/1997 | McMillan | B05D 1/00 | 257/E21.009 |
| 5,618,349 A * | 4/1997 | Yuuki | C23C 16/4412 | 118/715 |
| 5,688,565 A * | 11/1997 | McMillan | C23C 16/4412 | 257/E21.009 |
| 5,735,961 A * | 4/1998 | Shimada | C23C 16/4401 | 118/715 |
| 5,759,923 A * | 6/1998 | McMillan | B05D 1/00 | 257/E21.009 |
| 5,843,516 A * | 12/1998 | Derbenwick | C23C 18/1216 | 257/E21.272 |
| 5,925,188 A * | 7/1999 | Oh | C23C 16/24 | 118/715 |
| 5,965,219 A * | 10/1999 | Hayashi | B05D 1/00 | 257/E21.009 |
| 5,972,428 A * | 10/1999 | Hayashi | H01L 21/31691 | 257/E21.272 |
| 5,993,555 A * | 11/1999 | Hamilton | C23C 16/45561 | 118/715 |
| 6,056,994 A * | 5/2000 | Paz de Araujo | B05D 1/00 | 204/192.16 |
| 6,143,063 A * | 11/2000 | Hayashi | B05D 1/00 | 106/287.18 |
| 6,204,194 B1 * | 3/2001 | Takagi | C23C 16/4412 | 257/E21.279 |
| 6,321,680 B2 * | 11/2001 | Cook | C23C 16/44 | 118/625 |
| 6,352,593 B1 * | 3/2002 | Brors | C23C 16/44 | 118/641 |
| 6,352,594 B2 * | 3/2002 | Cook | C23C 16/44 | 118/641 |
| 6,383,300 B1 * | 5/2002 | Saito | C23C 16/345 | 118/715 |
| 6,444,262 B1 * | 9/2002 | Kitamura | C23C 16/4412 | 118/715 |
| 6,807,971 B2 * | 10/2004 | Saito | C23C 16/345 | 134/1 |
| 6,869,500 B2 | 3/2005 | Lee et al. | | |
| 6,881,295 B2 * | 4/2005 | Nagakura | C23C 16/401 | 118/715 |
| D552,047 S * | 10/2007 | Sugawara | D13/182 | |
| 7,422,635 B2 * | 9/2008 | Zheng | C23C 16/45546 | 118/715 |
| 7,622,007 B2 * | 11/2009 | Nakaiso | C23C 16/455 | 118/715 |
| 7,927,662 B2 * | 4/2011 | Matsuura | C23C 16/36 | 117/84 |
| 8,002,895 B2 * | 8/2011 | Inoue | C23C 16/345 | 118/715 |
| 8,148,271 B2 * | 4/2012 | Ueno | C23C 16/463 | 118/696 |
| 8,304,328 B2 * | 11/2012 | Maeda | C23C 16/345 | 257/E21.09 |
| 8,394,201 B2 * | 3/2013 | Kim | C23C 16/45546 | 118/715 |
| 8,420,167 B2 * | 4/2013 | Nakashima | C23C 16/345 | 427/248.1 |
| 8,431,494 B2 * | 4/2013 | Murakami | C23C 16/401 | 257/E21.274 |
| 8,808,455 B2 * | 8/2014 | Saito | H01L 21/02186 | 118/696 |
| 9,028,614 B2 * | 5/2015 | Hara | C30B 25/08 | 118/724 |
| 9,074,284 B2 * | 7/2015 | Fukuda | C23C 16/325 | |
| 9,163,311 B2 * | 10/2015 | Hasegawa | C23C 16/45578 | |
| 9,368,380 B2 * | 6/2016 | Yang | H01L 21/67303 | |
| 9,410,247 B2 * | 8/2016 | Lee | C23C 16/45565 | |
| 2001/0025605 A1 * | 10/2001 | Nagakura | C23C 16/401 | 118/715 |
| 2001/0029892 A1 * | 10/2001 | Cook | C23C 16/44 | 118/723 E |
| 2003/0049372 A1 * | 3/2003 | Cook | C23C 16/24 | 427/248.1 |
| 2003/0060030 A1 | 3/2003 | Lee et al. | | |
| 2004/0048439 A1 * | 3/2004 | Soman | H01L 21/02381 | 438/309 |
| 2005/0130451 A1 | 6/2005 | Lee et al. | | |
| 2005/0287806 A1 * | 12/2005 | Matsuura | C23C 16/36 | 438/680 |
| 2006/0029735 A1 * | 2/2006 | Ko | H01L 21/0223 | 427/248.1 |
| 2007/0131990 A1 * | 6/2007 | Jang | G02F 1/1303 | 257/291 |
| 2007/0157882 A1 * | 7/2007 | Ozaki | H01L 21/0223 | 118/715 |
| 2007/0178669 A1 * | 8/2007 | Noda | C23C 16/24 | 438/478 |
| 2007/0281084 A1 * | 12/2007 | Hirosawa | C23C 16/45565 | 427/248.1 |
| 2008/0213478 A1 * | 9/2008 | Matsuura | C23C 16/36 | 427/255.28 |
| 2009/0087964 A1 * | 4/2009 | Maeda | C23C 16/345 | 438/482 |
| 2009/0130829 A1 * | 5/2009 | Noda | C23C 16/0227 | 438/503 |
| 2009/0291566 A1 * | 11/2009 | Ueno | C23C 16/463 | 438/758 |
| 2009/0304924 A1 * | 12/2009 | Gadgil | C23C 16/4412 | 427/255.5 |
| 2010/0098851 A1 * | 4/2010 | Murakawa | C23C 16/45544 | 427/248.1 |
| 2010/0151682 A1 * | 6/2010 | Moriya | C23C 16/24 | 438/680 |

(56) References Cited

U.S. PATENT DOCUMENTS

| | | | | |
|---|---|---|---|---|
| 2010/0218724 A1* | 9/2010 | Okada | C23C 16/4405 | 118/724 |
| 2010/0255658 A1* | 10/2010 | Aggarwal | C23C 16/04 | 438/478 |
| 2010/0275848 A1* | 11/2010 | Fukuda | C23C 16/325 | 118/728 |
| 2011/0186984 A1* | 8/2011 | Saito | H01L 21/02186 | 257/734 |
| 2011/0203524 A1* | 8/2011 | Uno | C23C 16/405 | 118/730 |
| 2012/0000425 A1* | 1/2012 | Park | C23C 16/45565 | 118/724 |
| 2012/0180727 A1* | 7/2012 | Hasegawa | C23C 16/45578 | 118/730 |
| 2012/0199067 A1* | 8/2012 | Morozumi | H01L 21/67109 | 118/719 |
| 2012/0220108 A1* | 8/2012 | Hara | C30B 25/08 | 438/478 |
| 2013/0068159 A1* | 3/2013 | Maeda | C23C 16/345 | 118/666 |
| 2013/0125819 A1* | 5/2013 | Borean | C23C 16/301 | 118/725 |
| 2013/0252437 A1* | 9/2013 | Sano | H01L 21/02247 | 438/769 |
| 2014/0256152 A1* | 9/2014 | Ogawa | C23C 16/405 | 438/758 |
| 2014/0315375 A1* | 10/2014 | Yang | C23C 16/4412 | 438/488 |
| 2014/0345528 A1* | 11/2014 | Yang | H01L 21/67126 | |
| 2014/0345801 A1* | 11/2014 | Yang | C23C 16/4412 | 156/345.27 |
| 2014/0348617 A1* | 11/2014 | Yang | H01L 21/6719 | 414/172 |
| 2015/0013909 A1* | 1/2015 | Yang | C23C 16/4412 | 156/345.29 |
| 2015/0059978 A1* | 3/2015 | Park | C23C 16/04 | 156/345.24 |
| 2015/0337460 A1* | 11/2015 | Yang | H01L 21/67109 | 156/345.54 |
| 2015/0369539 A1* | 12/2015 | Yang | F27B 1/08 | 432/81 |
| 2015/0380284 A1* | 12/2015 | Yang | H01L 21/67109 | 219/407 |
| 2016/0013086 A1* | 1/2016 | Yang | H01L 21/67303 | 414/222.03 |

\* cited by examiner

APPARATUS FOR PROCESSING SUBSTRATE FOR SUPPLYING REACTION GAS HAVING PHASE DIFFERENCE

CROSS-REFERENCE TO RELATED APPLICATIONS

This U.S. non-provisional patent application claims priority under 35 U.S.C. §119 of Korean Patent Application No. 10-2011-0120256, filed on Nov. 17, 2011, the entire contents of which are hereby incorporated by reference.

BACKGROUND OF THE INVENTION

The present invention disclosed herein relates to an apparatus for processing a substrate, and more particularly, to a substrate processing apparatus for supplying a reaction gas having a phase difference.

Ordinary selective epitaxy processes involve deposition reaction and etching reaction. The deposition and etching reactions may occur simultaneously at slightly different reaction rates with respect to a polycrystalline layer and an epitaxial layer. While an existing polycrystalline layer and/or an amorphous layer are/is deposited on at least one second layer during the deposition process, the epitaxial layer is formed on a surface of a single crystal. However, the deposited polycrystalline layer is etched faster than the epitaxial layer. Thus, corrosive gas may be changed in concentration to perform a net selective process, thereby realizing the deposition of an epitaxial material and the deposition of a limited or unlimited polycrystalline material. For example, a selective epitaxy process may be performed to form an epitaxial layer formed of a material containing silicon on a surface of single crystal silicon without leaving the deposits on a spacer.

Generally, the selective epitaxy process has several limitations. To maintain selectivity during the selective epitaxy process, a chemical concentration and reaction temperature of a precursor should be adjusted and controlled over the deposition process. If an insufficient silicon precursor is supplied, the etching reaction is activated to decrease the whole process rate. Also, features of the substrate may be deteriorated with respect to the etching. If an insufficient corrosive solution precursor is supplied, selectivity for forming the single crystalline and polycrystalline materials over the surface of the substrate may be reduced in the deposition reaction. Also, typical selective epitaxy processes are performed at a high reaction temperature of about 800° C., about 1,000° C., or more. Here, the high temperature is unsuited for the manufacturing process due to uncontrolled nitridation reaction and thermal budge on the surface of the substrate.

SUMMARY OF THE INVENTION

The present invention provides a substrate processing apparatus in which a reaction gas uniformly flows within a process space.

The present invention also provides a substrate processing apparatus in which a reaction gas having a phase difference flows.

The present invention also provides a substrate processing apparatus in which a reaction gas is concentrated onto a substrate.

Further another object of the present invention will become evident with reference to following detailed descriptions and accompanying drawings.

Embodiments of the present invention provide substrate processing apparatuses in which processes with respect to substrates are performed, the substrate processing apparatuses including: a lower chamber having an opened upper side, the lower chamber including a passage allowing the substrates to pass therethrough in a side thereof; an external reaction tube closing the opened upper side of the lower chamber to provide a process space in which the processes are performed; a substrate holder on which the one ore more substrates are vertically stacked, the substrate holder being movable between a stacking position in which the substrates are stacked within the substrate holder and a process position in which the processes with respect to the substrates are performed; and a gas supply unit disposed inside the external reaction tube to supply a reaction gas into the process space, the gas supply unit forming a flow of the reaction gas having different phase differences in a vertical direction.

In some embodiments, the gas supply unit may include: a plurality of supply nozzles disposed along an inner wall of the external reaction tube, the plurality of supply nozzles being disposed at heights different from each other to discharge the reaction gas; a plurality of supply tubes respectively connected to the plurality of supply nozzles to supply the reaction gas into each of the supply nozzles; a plurality of exhaust nozzles disposed along the inner wall of the external reaction tube, the plurality of exhaust nozzles being disposed at heights different from each other to suction a non-reaction gas and byproducts within the process space; and a plurality of exhaust tubes respectively connected to the plurality of exhaust nozzles to allow the non-reaction gas and the byproducts suctioned through each of the exhaust nozzles to pass therethrough.

In other embodiments, the supply nozzles and the exhaust nozzles may be disposed to respectively correspond to the substrates stacked on the substrate holder when the substrate holder is disposed at the process position.

In still other embodiments, each of the supply nozzles may be a circular tube having a supply hole through which the reaction gas is discharged and having a circular sectional area, each of the exhaust nozzles may have an inner space with a section area gradually decreasing in a suction direction thereof and an exhaust hole defined in a front end thereof and having a slot-shaped sectional area to suction the non-reaction gas and the byproducts, and a center of the supply hole may be symmetric to that of the exhaust hole with respect to the same height.

In even other embodiments, each of the supply nozzles may have an inner space with a sectional area gradually increasing in a discharge direction thereof and a supply hole defined in a front end thereof and having a slot-shaped sectional area to discharge the reaction gas, each of the exhaust nozzles may have an inner space with a sectional area gradually decreasing a suction direction thereof and an exhaust hole defined in a front end thereof and having a slot-shaped sectional area to suction the non-reaction gas and the byproducts, and a center of the supply hole may be symmetric to that of the exhaust hole with respect to the same height.

In yet other embodiments, each of the supply nozzles may have an inner space with a sectional area gradually increasing in a discharge direction thereof, a supply hole defined in a front end thereof and having a slot-shaped sectional area to discharge the reaction gas, and an injection plate disposed on the supply hole and having a plurality of injection holes, each of the exhaust nozzles may have an inner space with a sectional area gradually decreasing a suction direction thereof and an exhaust hole defined in a front end thereof and having a slot-shaped sectional area to suction the non-reaction gas and the byproducts, and a center of the supply hole may be symmetric to that of the exhaust hole with respect to the same height.

In further embodiments, the gas supply unit may further include a plurality of supply lines respectively connected to the supply nozzles to supply the reaction gas into each of the supply nozzles.

In still further embodiments, the substrate processing apparatuses may further include a support flange disposed between the lower chamber and the external reaction tube, wherein the supply lines may be connected to the supply nozzles through the support flange, respectively.

In even further embodiments, the substrate processing apparatuses may further include an internal reaction tube disposed inside the external reaction tube, the internal reaction tube being disposed around the substrate holder to divide a reaction region with respect to the substrates.

In yet further embodiments, the substrate processing apparatuses may further include thermocouples vertically disposed inside the external reaction tube.

In much further embodiments, the substrate processing apparatuses may further include a rotation shaft connected to the substrate holder, the rotation shaft being rotated in a preset direction during the processes.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
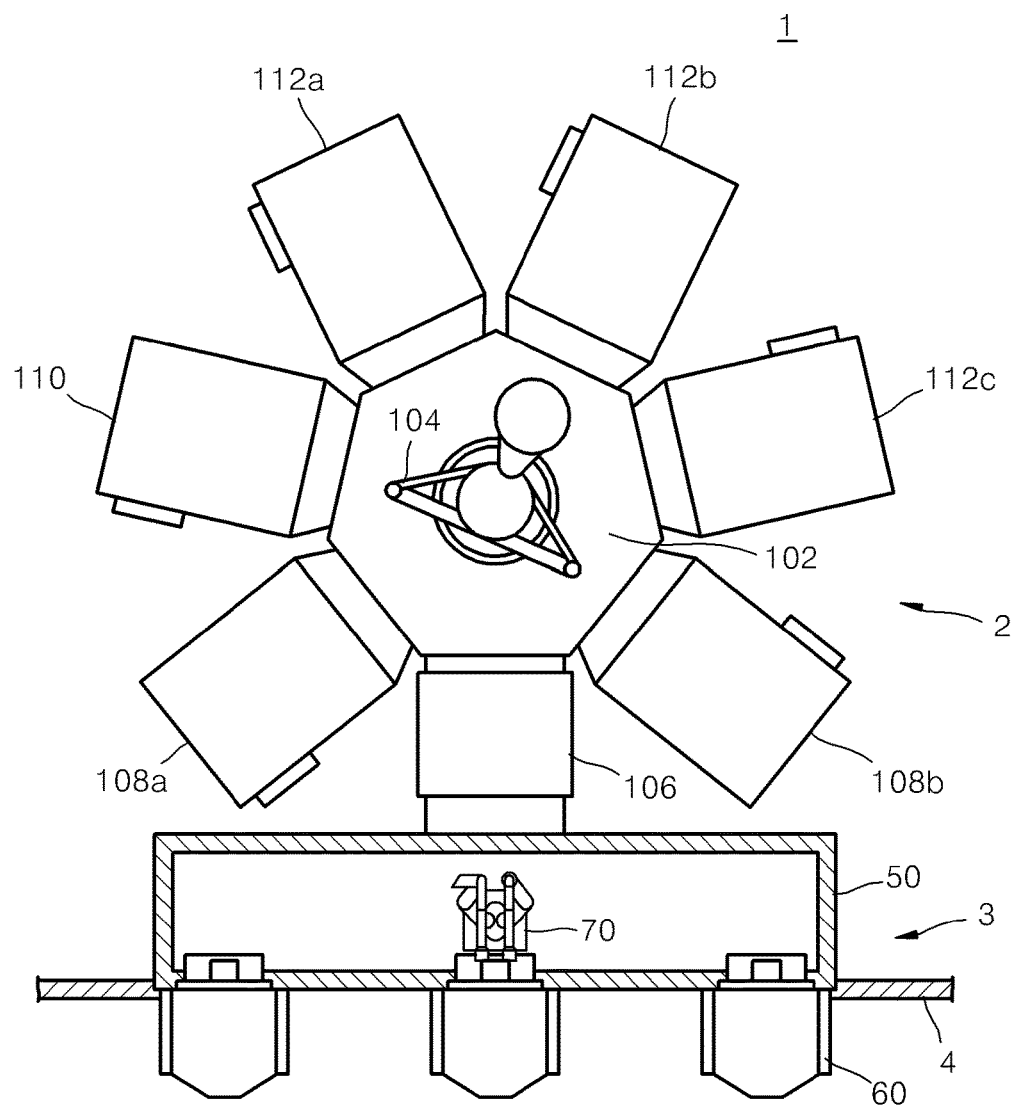
FIG. 1 is a schematic view of a semiconductor manufacturing equipment according to an embodiment of the present invention.

Hereinafter, exemplary embodiments of the present invention will be described in detail with reference to FIGS. 1 to 17. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the shapes of components are exaggerated for clarity of illustration.

Hereinafter, although an epitaxial process is described as an example, the present invention may be applied to various semiconductor manufacturing processes including the epitaxial process.

FIG. 1 is a schematic view of a semiconductor manufacturing equipment 1 according to an embodiment of the present invention. The semiconductor manufacturing equipment 1 includes process equipment 2, an equipment front end module (EFEM) 3, and an interface wall 4. The EFEM 3 is mounted on a front side of the process equipment 2 to transfer a wafer W between a container (not shown) in which substrates S are received and the process equipment 2.

The EFEM 3 includes a plurality of loadports 60 and a frame 50. The frame 50 is disposed between the loadports 60 and the process equipment 2. The container in which the substrate S is received is placed on the loadports by a transfer unit (not shown) such as an overhead transfer, an overhead conveyor, or an automatic guided vehicle.

An airtight container such as a front open unified pod (FOUP) may be used as the container. A frame robot 70 for transferring the substrate S between the container placed on the loadports 60 and the process equipment 2 is disposed within the frame 50. A door opener (not shown) for automatically opening or closing a door of the container may be disposed within the frame 50. Also, a fan filter unit (FFU) (not shown) for supplying clean air into the frame 50 may be provided within the frame 50 so that the clean air flows downward from an upper side within the frame 50.

Predetermined processes with respect to the substrate S are performed within the process equipment 2. The process equipment 2 includes a transfer chamber 102, a loadlock chamber 106, cleaning chambers 108a and 108b, a buffer chamber 110, and epitaxial chambers (or epitaxial apparatuses) 112a, 112b, and 112c. The transfer chamber 102 may have a substantially polygonal shape when viewed from an upper side. The loadlock chamber 106, the cleaning chambers 108a and 108b, the buffer chamber 110, and the epitaxial chambers 112a, 112b, and 112c are disposed on a side surface of the transfer chamber 102.

The loadlock chamber 106 is disposed on a side surface adjacent to the EFEM 3 among side surfaces of the transfer chamber 102. The substrate S is loaded to the process equipment 2 after the substrate S is temporarily stayed within the loadlock chamber 106 so as to perform the processes. After the processes are completed, the substrate S is unloaded from the process equipment 2 and then is temporarily stayed within the loadlock chamber 106. The transfer chamber 102, the cleaning chambers 108a and 108b, the buffer chamber 110, and the epitaxial chambers 112a, 112b, and 112c are maintained in a vacuum state. The loadlock chamber 106 is switched from the vacuum state into an atmospheric state. The loadlock chamber 106 prevents external contaminants from being introduced into the transfer chamber 102, the cleaning chambers 108a and 108b, the buffer chamber 110, and the epitaxial chambers 112a, 112b, and 112c. Also, since the substrate S is not exposed to the atmosphere during the transfer of the substrate S, it may prevent an oxide layer from being grown on the substrate S.

Gate valves (not shown) are disposed between the loadlock chamber 106 and the transfer chamber 102 and between the loadlock chamber 106 and the EFEM 3. When the substrate S is transferred between the EFEM 3 and the loadlock chamber 106, the gate valve disposed between the loadlock chamber 106 and the transfer chamber 102 is closed. Also, when the substrate S is transferred between the loadlock chamber 106 and the transfer chamber 102, the gate valve disposed between the loadlock chamber 106 and the EFEM 3 is closed.

A substrate handler 104 is disposed in the transfer chamber 102. The substrate handler 104 transfers the substrate S between the loadlock chamber 106, the cleaning chamber 108a and 108b, the buffer chamber 110, and the epitaxial chambers 112a, 112b, and 112c. The transfer chamber 102 is sealed so that the transfer chamber 102 is maintained in the vacuum state when the substrate S is transferred. The maintenance of the vacuum state is for preventing the substrate S from being exposed to contaminants (e.g., $O_2$, particle materials, and the like).

The epitaxial chambers 112a, 112b, and 112c are provided to form an epitaxial layer on the substrate S. In the current embodiment, three epitaxial chambers 112a, 112b, and 112c are provided. Since it takes a relatively long time to perform an epitaxial process when compared to that of a cleaning process, manufacturing yield may be improved through the plurality of epitaxial chambers. Unlike the current embodiment, four or more epitaxial chambers or two or less epitaxial chambers may be provided.

The cleaning chambers 108a and 108b are configured to clean the substrate S before the epitaxial process is performed on the substrate S within the epitaxial chambers 112a, 112b, and 112c. To successfully perform the epitaxial process, an amount of oxide remaining on the crystalline substrate should be minimized. If an oxygen content on a surface of the substrate S is too high, oxygen atoms may interrupt crystallographic disposition of materials to be deposited on a seed substrate, and thus, it may have a bad influence on the epitaxial process. For example, when a silicon epitaxial deposition is performed, excessive oxygen on the crystalline substrate may displace a silicon atom from its epitaxial position by oxygen atom clusters in atom units. The local atom displacement may cause errors in follow-up atom arrangement when a layer is more thickly grown. This phenomenon may be so-called stacking faults or hillock defects. Oxygenation on the surface of the substrate may, for example, occur when the substrate is exposed to the atmosphere while the substrate is transferred. Thus, the cleaning process for removing a native oxide (or a surface oxide) formed on the substrate S may be performed within the cleaning chambers 108a and 108b.

The cleaning process may be a dry etching process using hydrogen (H*) and $NF_3$ gases having a radical state. For example, when the silicon oxide formed on the surface of the substrate is etched, the substrate is disposed within a chamber, and then, the chamber has a vacuum atmosphere therein to generate an intermediate product reacting with the silicon oxide within the chamber.

For example, when reaction gases such as a hydrogen radical gas (H*) and a fluoride gas (for example, nitrogen fluoride ($NF_3$)) are supplied into the chamber, the reaction gases are reduced as expressed in the following reaction formula (1) to generate an intermediate product such as $NH_xF_y$ (where x and y are certain integers).

$$H^* + NF_3 \Rightarrow NH_xF_y \qquad (1)$$

Since the intermediate product has high reactivity with silicon oxide ($SiO2$), when the intermediate product reaches a surface of the silicon substrate, the intermediate product selectively reacts with the silicon oxide to generate a reaction product ($(NH_4)_2SiF_6$) as expressed in following reaction formula (2).

$$NH_xF_y + SiO_2 \Rightarrow (NH_4)_2SiF_6 + H_2O \qquad (2)$$

Thereafter, when the silicon substrate is heated at a temperature of about 100° C. or more, the reaction product is pyrolyzed as expressed in following reaction formula (3) to form a pyrolyzed gas, and then, the pyrolyzed gas is evaporated. As a result, the silicon oxide may be removed from the surface of the substrate. As shown in the following reaction formula (3), the pyrolysis gas includes a gas containing fluorine such as an HF gas or a $SiF_4$ gas.

$$(NH_4)_2SiF_6 \Rightarrow NH_3 + HF + SiF_4 \qquad (3)$$

As described above, the cleaning process may include a reaction process for generating the reaction product and a heating process for pyrolyzing the reaction product. The reaction process and the heating process may be performed at the same time within the cleaning chambers 108a and 108b. Alternatively, the reaction process may be performed within one of the cleaning chambers 108a and 108b, and the heating process may be performed within the other one of the cleaning chambers 108a and 108b.

The buffer chamber 110 provides a space in which the substrate S, on which the cleaning process is completed, is stacked and a space in which the substrate S, on which the epitaxial process is performed, is stacked. When the cleaning process is completed, the substrate S is transferred into the buffer chamber 110 and then stacked within the buffer chamber 110 before the substrate S is transferred into the epitaxial chambers 112a, 112b, and 112c. The epitaxial chambers 112a, 112b, and 112c may be batch type chambers in which a single process is performed on a plurality of substrates. When the epitaxial process is completed within the epitaxial chambers 112a, 112b, and 112c, substrates S on which the epitaxial process is performed are successively stacked within the buffer chamber 110. Also, substrates S on which the cleaning process is completed are successively stacked within the epitaxial chambers 112a, 112b, and 112c. Here, the substrates S may be vertically stacked within the buffer chamber 110.

Figure 2:
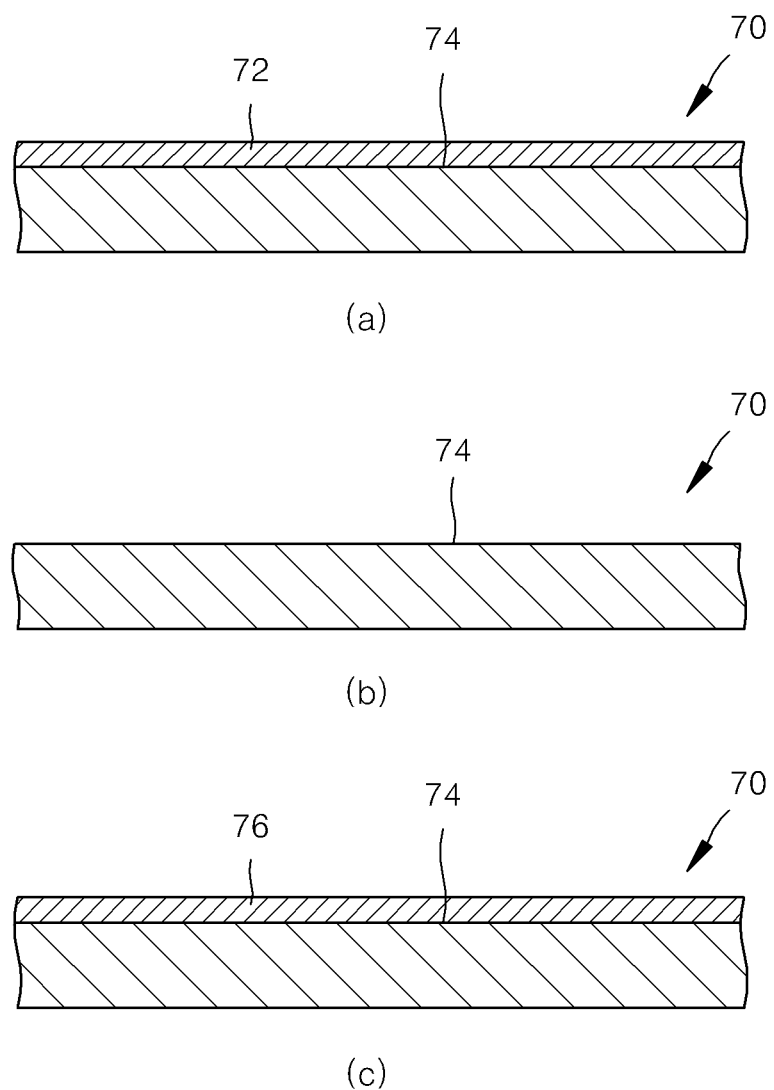
FIG. 2 is a view of a substrate processed according to an embodiment of the present invention.

FIG. 2 is a view of a substrate processed according to an embodiment of the present invention. As described above, the cleaning process is performed on the substrate S within the cleaning chambers 108a and 108b before the epitaxial process is performed on the substrate S. Thus, an oxide 72 formed on a surface of a substrate 70 may be removed through the cleaning process. The oxide may be removed through the cleaning process within the cleaning chamber 108a and 108b. Also, an epitaxy surface 74 formed on the surface of the substrate 70 may be exposed through the cleaning process to assist the growth of an epitaxial layer.

Thereafter, an epitaxial process is performed on the substrate 70 within the epitaxial chambers 112a, 112b, and 112c. The epitaxial process may be performed by chemical vapor deposition. The epitaxial process may be performed to form an epitaxy layer 76 on the epitaxy surface 74. The epitaxy surface 74 formed on the substrate 70 may be exposed by reaction gases including a silicon gas (e.g., $SiCl_4$, $SiHCl_3$, $SiH2Cl_2$, $SiH_3Cl$, $Si_2H_6$, or $SiH_4$) and a carrier gas (e.g., $N_2$ and/or $H_2$). Also, when the epitaxy layer 76 is required to include a dopant, a silicon-containing gas may include a dopant-containing gas (e.g., $AsH_3$, $PH_3$, and/or $B_2H_6$).

Figure 3:
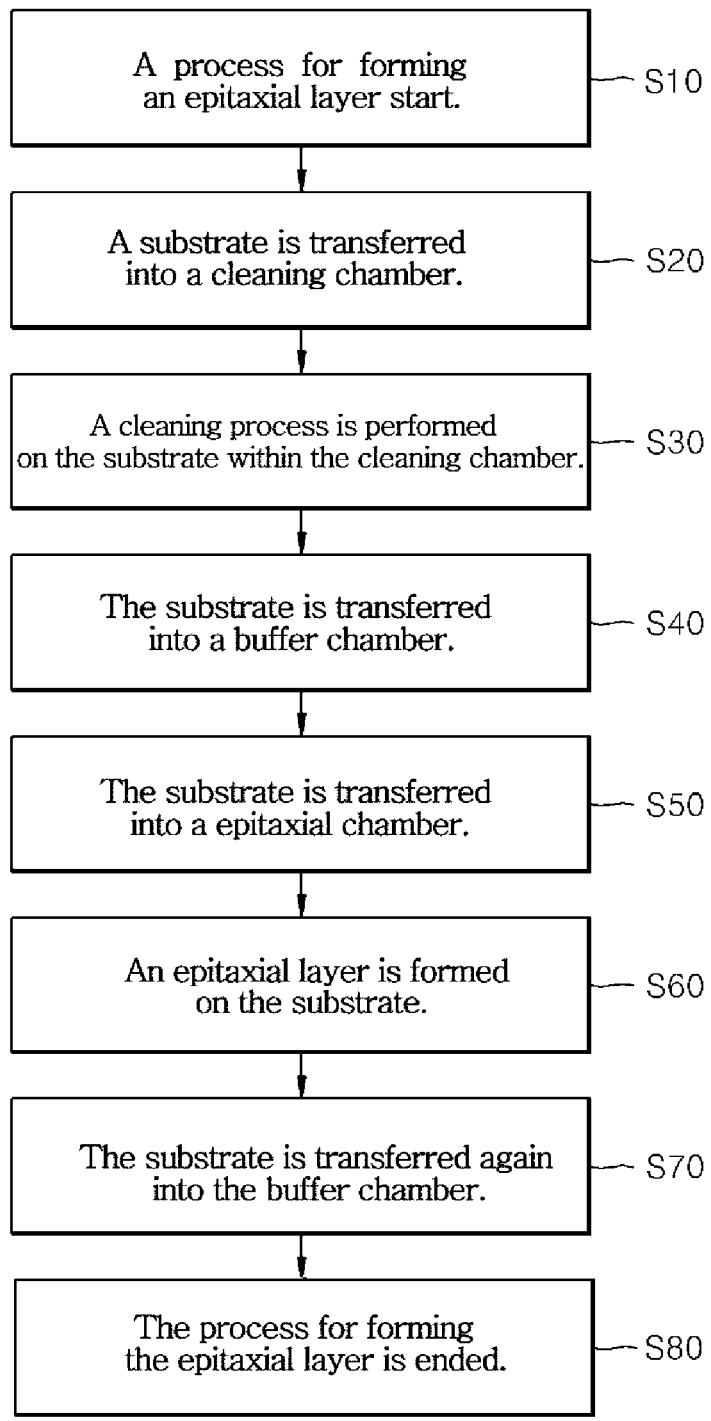
FIG. 3 is a flowchart illustrating a process for forming an epitaxial layer according to an embodiment of the present invention.

FIG. 3 is a flowchart illustrating a process for forming an epitaxial layer according to an embodiment of the present invention. In operation S10, a process for forming an epitaxial layer starts. In operation S20, a substrate S is transferred into cleaning chambers 108a and 108b before an epitaxial process is performed on the substrate S. Here, a substrate handler 104 transfers the substrate S into the cleaning chambers 108a and 108b. The substrate S is transferred through a transfer chamber 102 in which a vacuum state is maintained. In operation S30, a cleaning process is performed on the substrate S. As described above, the cleaning process includes a reaction process for generating a reaction product and a heating process for pyrolyzing the reaction product. The reaction process and the heating process may be performed at the same time within the cleaning chambers 108a and 108b. Alternatively, the reaction process may be performed within one of the cleaning chambers 108a and 108b, and the heating process may be performed within the other one of the cleaning chambers 108a and 108b.

In operation S40, the substrate S on which the cleaning process is completed is transferred into a buffer chamber 110 and is stacked within the buffer chamber 110. Then, the substrate S is on standby within the buffer chamber 110 so as to perform the epitaxial process. In operation S50, the substrate S is transferred into epitaxial chambers 112a, 112b, and 112c. The transfer of the substrate S is performed through the transfer chamber 102 in which the vacuum state is maintained. In operation S60, an epitaxial layer may be formed on the substrate S. In operation S70, the substrate S is transferred again into the buffer chamber 110 and is stacked within the buffer chamber 110. Thereafter, in operation S80, the process for forming the epitaxial layer is ended.

Figure 4:
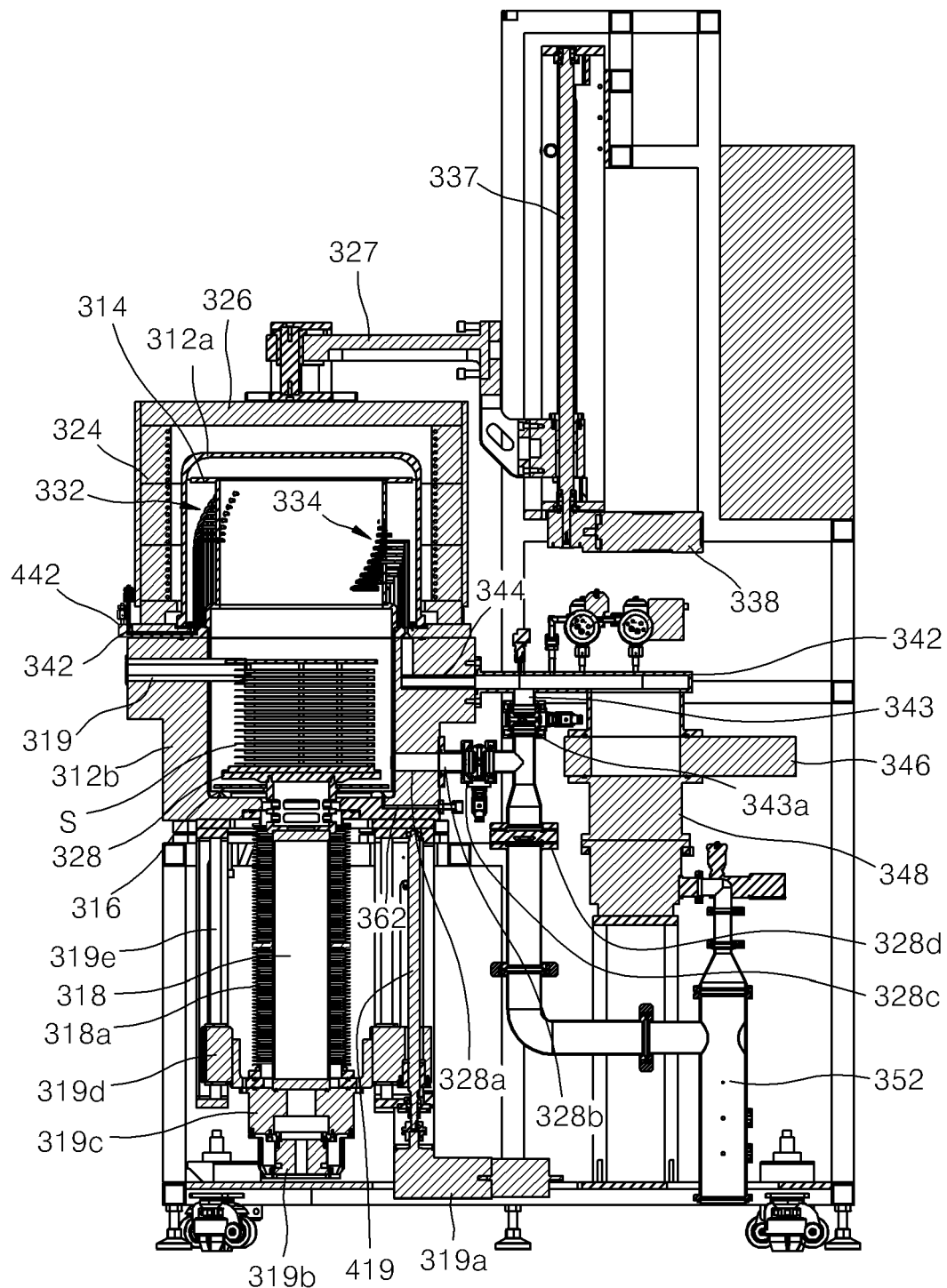
FIG. 4 is a schematic view illustrating an epitaxial apparatus of FIG. 1.
Figure 5:
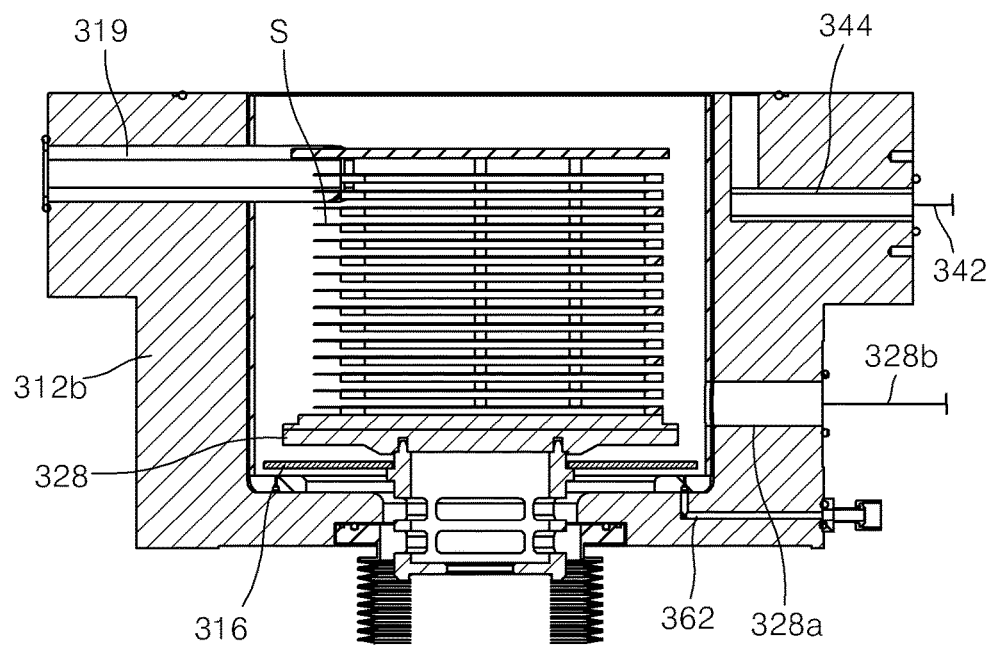
FIG. 5 is a cross-sectional view illustrating a lower chamber and a substrate holder of FIG. 1.

FIG. 4 is a schematic view illustrating an epitaxial apparatus of FIG. 1. FIG. 5 is a cross-sectional view illustrating a lower chamber and a substrate holder of FIG. 1. An epitaxial apparatus (or an epitaxial chamber) includes a lower chamber 312b having an opened upper side. The lower chamber 312b is connected to a transfer chamber 102. The lower chamber 312b has a passage 319 connected to the transfer chamber 102. A substrate S may be loaded from the transfer chamber 102 into the lower chamber through the passage 319. A gate valve (not shown) may be disposed outside the passage 319. The passage 319 may be opened or closed by the gate valve.

The epitaxial apparatus includes a substrate holder 328 on which a plurality of substrates S are stacked. The substrates S are vertically stacked on the substrate holder 328. For example, fifteen substrates S may be stacked on the substrate holder 328. When the substrate holder 328 is disposed in a stacking space (or at a "stacking position) provided within the lower chamber 312b, the substrates S may be stacked within the substrate holder 328. As described below, the substrate holder 328 may be elevated. When the substrates S are stacked into a slot of the substrate holder 328, the substrate holder 328 may be elevated so that substrates S are stacked into the next slot of the substrate holder 328. When all the substrates are stacked on the substrate holder 328, the substrate holder 328 is moved into an external reaction tube 312a (or to a "process position"), an epitaxial process is performed within the external reaction tube 312a.

Figure 11:
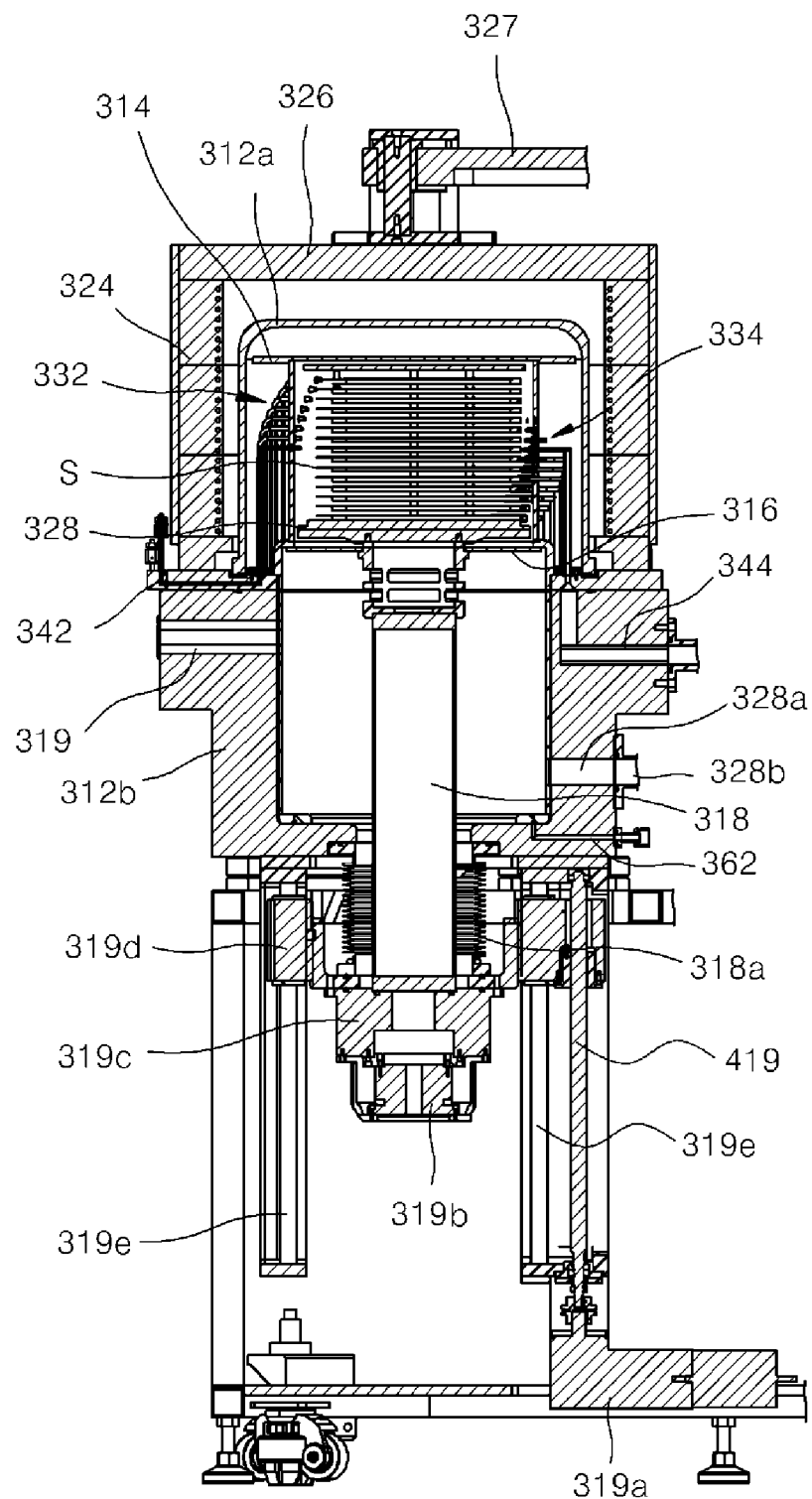
FIG. 11 is a view illustrating a state in which the substrate holder of FIG. 1 is moved into a process position.

A heat-shield plate 316 is disposed under the substrate holder 328 and elevated together with the substrate holder 328. When the substrate holder 328 is moved in position to the process position, as shown in FIG. 11, the heat-shield plate 316 closes an opened lower portion of the internal reaction tube 314. The heat-shield plate 316 may be formed of ceramic, quartz, or a metal material coated with ceramic. The heat-shield plate 316 prevents heat within a reaction region from being transmitted into the stacking space when processes are performed. A portion of a reaction gas supplied into the reaction region may be moved into the stacking space through the opened lower side of the internal reaction tube 314. Here, when the stacking space has a temperature greater than a predetermined temperature, a portion of the reaction gas may be deposited on an inner wall of the stacking space. Thus, it may be necessary to prevent the stacking space from being heated due to the heat-shield plate 316. Therefore, it may prevent the reaction gas from being deposited on the inner wall of the stacking space.

A lower chamber 312b includes an exhaust port 344, an auxiliary exhaust port 328a, and an auxiliary gas supply port 362. The exhaust port 344 has a "└ " shape. An exhaust nozzle unit 334 that will be described later are connected to a first exhaust line 342 through the exhaust port 344. The auxiliary exhaust port 328a is connected to the auxiliary exhaust line 328b. A gas within the stacking space of the lower chamber 312b may be exhausted the auxiliary exhaust port 328a.

The auxiliary gas supply port 362 is connected to a auxiliary gas supply line (not shown) to supply a gas supplied through the auxiliary gas supply line into the stacking space. For example, an inert gas may be supplied into the stacking space through the auxiliary gas supply port 362. As the inert gas is supplied into the stacking space, it may prevent the reaction gas supplied into the process space from being introduced into the stacking space.

Furthermore, since the inert gas is continuously supplied into the stacking space and exhausted through the auxiliary exhaust port 328a, it may prevent the reaction gas supplied into the process space from being moved into the stacking space. Here, the stacking space may be set so that an internal pressure thereof is slightly greater than that of the process space. When the stacking pace has a pressure slightly greater than that of the process space, the reaction gas within the process space is not moved into the stacking space.

Figure 6:
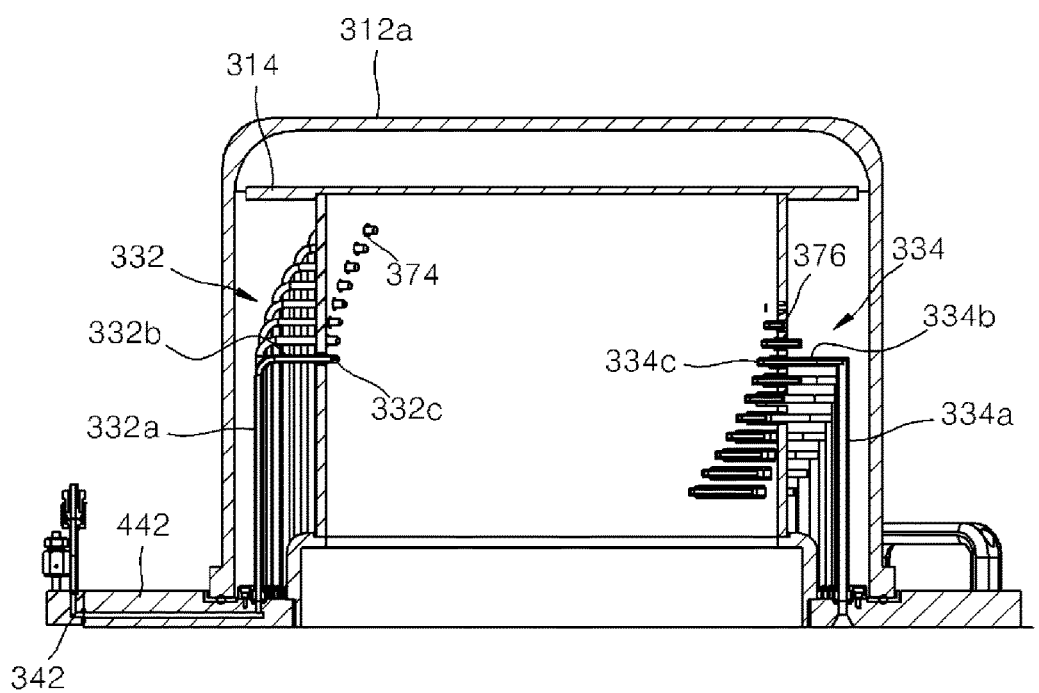
FIG. 6 is a schematic cross-sectional view illustrating an external reaction tube, an internal reaction tube, supply nozzles, and exhaust nozzles of FIG. 1.

FIG. 6 is a schematic cross-sectional view illustrating the external reaction tube, the internal reaction tube, the supply nozzles, and the exhaust nozzles of FIG. 1. The external reaction tube 312a closes an opened upper side of the lower chamber 312b to provide the process space in which the epitaxial process is performed. A support flange 442 is disposed between the lower chamber 312b and the external reaction tube 312a. The external reaction tube 312 is disposed on the support flange 442. The stacking space of the lower chamber 312b communicates with the process space of the external reaction tube 312a through an opening defined in a center of the support flange 442. As described above, when all the substrates are stacked on the substrate holder 328, the substrate holder 328 may be moved into the process space of the external reaction tube 312a.

The internal reaction tube 314 is disposed inside the external reaction tube 312a to provide a reaction region with respect to a substrate S. The inside of the external reaction tube 312a is divided into a reaction region and a non-reaction region by the internal reaction tube 314. The reaction region is defined inside the internal reaction tube 314, and the non-reaction region is defined outside the internal reaction tube 314. When the substrate holder 328 is moved to the process position, the substrate holder 328 is disposed in the reaction region. The reaction region has a volume less than that of the process space. Thus, when the reaction gas is supplied into the reaction region, a usage amount of the reaction gas may be minimized. Also, the reaction gas may be concentrated onto the substrates S stacked within the substrate holder 328. The internal reaction tube 314 has a closed upper side and an opened lower side. Thus, the substrate holder 328 is moved into the reaction region through the lower side of the internal reaction tube 314.

As shown in FIG. 4, a side heater 324 and an upper heater 326 are disposed to surround the external reaction tube 312a. The side heater 324 and the upper heater 326 heat the process space within the external reaction tube 312a. Thus, the reaction space (or the reaction region) may reach a temperature enough to perform the epitaxial process. The side heater 324 and the upper heater 326 are connected to an upper elevation rod 337 through a support frame 327. When the upper elevation rod 337 is rotated by an elevation motor 338, the support frame 327 may be elevated.

The epitaxial apparatus further includes a gas supply unit. The gas supply unit includes a supply nozzle unit 332 and an exhaust nozzle unit 334. The supply nozzle unit 332 includes a plurality of supply tubes 332a and a plurality of supply nozzles 332b. The supply nozzles 332b are connected to the supply tubes 332a, respectively. Each of the supply nozzles 332b has a circular tube shape. A supply hole 332c is defined in a front end of each of the supply nozzles 332b. The reaction gas is discharged through the supply hole 332c. The supply hole 332c has a circular sectional area. As shown in FIG. 6, the supply holes 332c of the supply nozzles 332b may be defined at heights different from each other.

The supply tubes 332a and the supply nozzles 332b are disposed inside the external reaction tube 312a. The supply tubes 332a extend vertically. The supply nozzles 332b may be disposed substantially perpendicular to the supply tubes 332a. The supply holes 332c are defined inside the internal reaction tube 314. Thus, the reaction gas discharged through the supply holes 332c may be concentrated into the reaction region within the internal reaction tube 314. The internal reaction tube 314 has a plurality of through-holes 374. The supply holes 332c of the supply nozzles 332b may be defined inside the internal reaction tube 314 through the through-holes 374.

Figure 7:
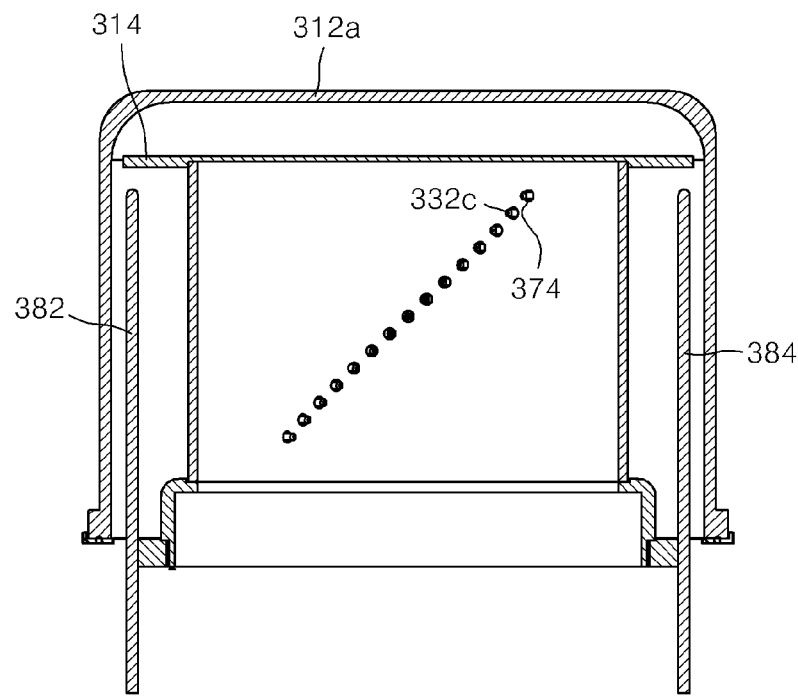
FIG. 7 is a cross-sectional view illustrating arrangements of the supply nozzles and thermocouples of FIG. 1.

FIG. 7 is a cross-sectional view illustrating arrangements of the supply nozzles and thermocouples of FIG. 1. Referring to FIG. 7, the supply nozzles 332b have supply holes 332c, each having a circular sectional area, respectively. The supply holes 332c of the supply nozzles 332b are defined in a circumference direction along an inner wall of the internal reaction tube 314. Also, the supply holes 332c are defined at heights different from each other. When the substrate holder 328 is moved into the process position, the supply nozzles 332b spray the reaction gas onto each of the substrates S placed on the substrate holder 328. Here, the supply holes 332c are defined at heights substantially equal to those of the substrates S, respectively. As shown in FIG. 6, the supply nozzles 332b are connected to reaction gas sources (not shown) through the supply lines 342 disposed in the support flange 442, respectively.

Each of reaction gas sources may supply a deposition gas (a silicon gas (e.g., $SiCl_4$, $SiHCl_3$, $SiH_2Cl_2$, $SiH_3Cl$, $Si_2H_6$, or $SiH_4$)), a carrier gas (e.g., $N_2$ and/or $H_2$), or an etching gas. A selective epitaxy process involves deposition reaction and etching reaction. Although not shown in the current embodiment, when an epitaxy layer is required to include a dopant, a dopant-containing gas (e.g., arsine ($AsH_3$), phosphine ($PH_3$), and/or diborane ($B_2H_6$)) may be supplied. Also, in case of a cleaning or etching process, hydrogen chloride (HCl) may be supplied.

As shown in FIG. 6, the exhaust nozzle unit 334 includes a plurality of exhaust tubes 334a and a plurality of exhaust nozzles 334b. The exhaust nozzles 334b are connected to the exhaust tubes 334a, respectively. An exhaust hole 334c is defined in a front end of each of the exhaust nozzles 334b to suction a non-reaction gas and byproducts. The exhaust hole 334c has a sectional area having a slot shape. As shown in FIG. 6, the exhaust nozzles 334b may be disposed at heights different from those of the exhaust holes 334c.

The exhaust tubes 334a and the exhaust nozzles 334b are disposed inside the external reaction tube 312a. The exhaust tubes 334a extend vertically. The exhaust nozzles 334b may be disposed substantially perpendicular to the exhaust tubes 334a. The exhaust holes 334c are defined inside the internal reaction tube 314. Thus, the non-reaction gas and byproducts may be effectively suctioned from the reaction region within the internal reaction tube 314 through the exhaust holes 334c. The internal reaction tube 314 has a plurality of through-holes 376. The exhaust holes 334c of the exhaust nozzles 334b may be defined inside the internal reaction tube 314 through the through-holes 376.

Figure 8:
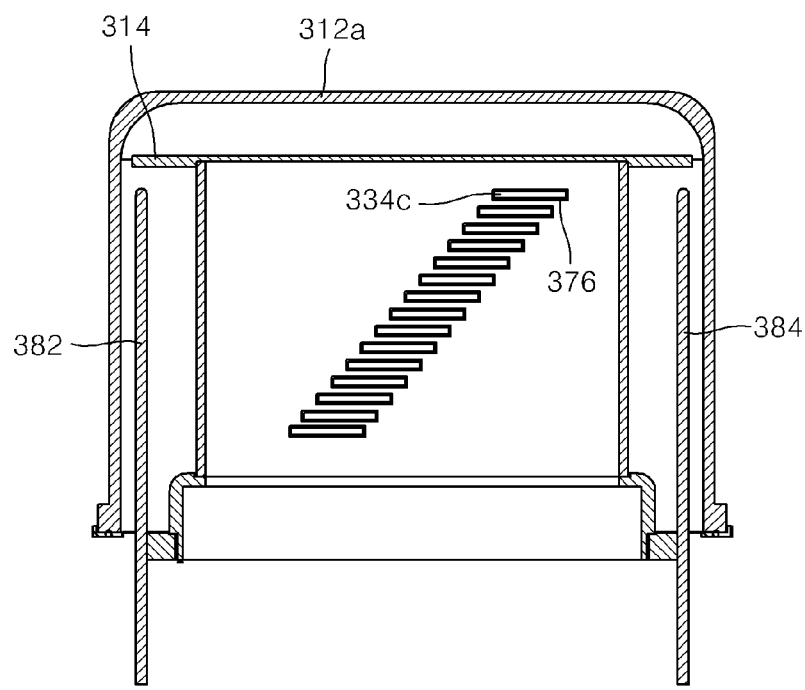
FIG. 8 is a cross-sectional view illustrating arrangements of the exhaust nozzles and the thermocouples of FIG. 1.

FIG. 8 is a cross-sectional view illustrating arrangements of the exhaust nozzles and the thermocouples of FIG. 1. Referring to FIG. 8, the exhaust nozzles 334b have exhaust holes 334c, each having a slot-shaped sectional area, respectively. The exhaust holes 334c of the exhaust nozzles 334b are defined in a circumference direction along the inner wall of the internal reaction tube 314. Also, the exhaust holes 334c are defined at heights different from each other. The substrate holder 328 is moved into the process position, the supply nozzles 332b spray the reaction gas onto each of the substrates S placed on the substrate holder 328. Here, the non-reaction gas and byproducts may be generated within the internal reaction tube 314. The exhaust nozzles 334b suction the non-reaction gas and the byproducts to discharge the non-reaction gas and the byproducts to the outside. The exhaust holes 334c are defined at heights substantially equal to those of the substrates S, respectively. As shown in FIG. 4, the exhaust nozzles 334b are connected to the first exhaust line 342 through the exhaust port 344 disposed in the lower chamber 312b to discharge the non-reaction gas and the byproducts through the first exhaust line 342. The switching valve 346 is disposed on the first exhaust line 342 to open or close the first exhaust line 342. The turbo pump 348 is disposed on the first exhaust line 342 to forcibly discharge the non-reaction gas and the byproducts through the first exhaust line 342. The first exhaust line 342 is connected to the second exhaust line 352 to discharge the non-reaction gas and the byproducts, which are moved along the first exhaust line 342, through the second exhaust line 352.

The auxiliary exhaust port 328a is disposed in the lower chamber 312b. The auxiliary exhaust line 328b is connected to the auxiliary exhaust port 328a. The auxiliary exhaust line 328b is connected to the second exhaust line 352. The first and second auxiliary valves 328c and 328d are disposed on the auxiliary exhaust line 328b to open or close the auxiliary exhaust line 328b. The auxiliary exhaust line 328b is connected to the first exhaust line 342 through a connection line 343. A connection valve 343a is disposed on the connection line 343 to open or close the connection line 343.

As shown in FIGS. 7 and 8, thermocouples 382 and 384 are disposed between the external reaction tube 312a and the internal reaction tube 314. The thermocouples 382 and 384 are vertically disposed to measure temperatures according to heights. Thus, a worker may grasp temperatures within the process space according to the heights. As a result, effects of temperature distribution on the process may be previously checked.

Figure 9:
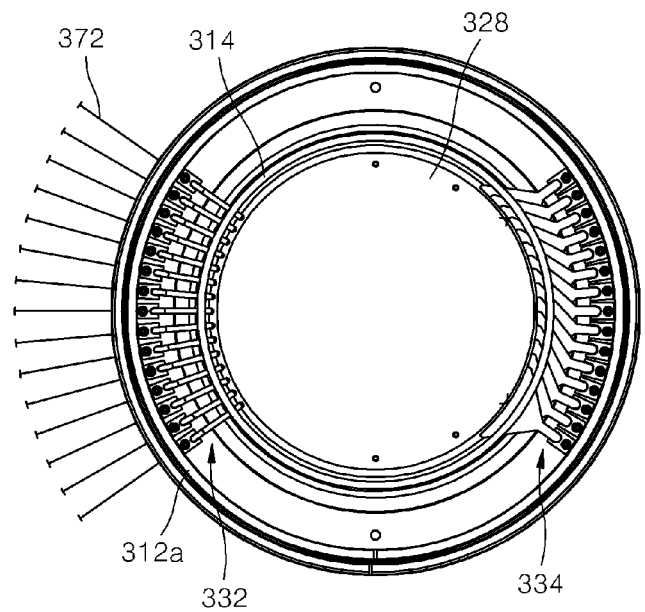
FIG. 9 is a view of supply lines respectively connected to supply nozzles of FIG. 1.

FIG. 9 is a view of supply lines respectively connected to supply nozzles of FIG. 1. As shown in FIG. 9, the supply nozzles 332 are connected to the reaction gas sources (not shown) through the separate supply lines 342. Thus, the reaction gas may be uniformly supplied into the reaction region of the internal reaction tube 314 through the plurality of supply nozzles 332. If one supply line 342 is connected to a plurality of supply nozzles 332, the reaction gas may be supplied with different flow rates according to the supply nozzles 332. Thus, a process rate may vary according to the positions of the substrate holder 328.

Figure 10:
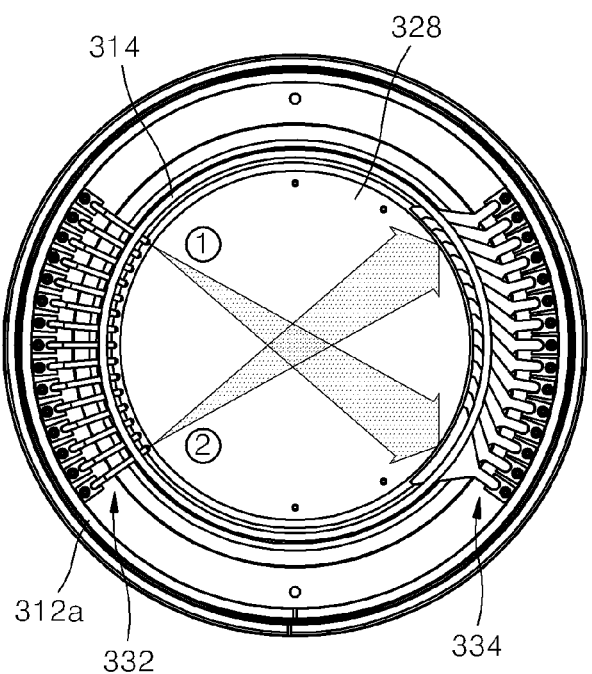
FIG. 10 is a view illustrating a flow of a reaction gas within the internal reaction tube of FIG. 1.

FIG. 10 is a view illustrating a flow of a reaction gas within the internal reaction tube of FIG. 1. As described above, the supply holes 332c of the supply nozzles 332b are defined in the circumference direction along the inner wall of the internal reaction tube 314. Also, the supply holes 332c are defined at height different from each other. Also, the exhaust holes 334c of the exhaust nozzles 334b are defined in the circumference direction along the inner wall of the internal reaction tube 314. Also, the exhaust holes 334c are defined at heights different from each other. Here, a center of each of the supply holes 332c is symmetric to that of each of the exhaust holes 334c with respect to the same height. That is, the supply hole 332c of the supply nozzle 332b and the exhaust hole 334c of the exhaust nozzle 334b are disposed opposite to each other with respect to a center of the substrate S stacked on the substrate holder 328. Thus, the reaction gas sprayed from the supply nozzle 332b flows toward the exhaust nozzle 334b disposed opposite to the supply nozzle 332b (indicated as an arrow). Thus, it may secure a sufficient time for which the reaction gas and the substrate S react with each other. Here, the non-reaction gas and the byproducts generated during the process are suctioned and discharged through the exhaust nozzle 334b.

As shown in FIG. 10, a flow of the reaction gas may vary according to a height of the substrates S stacked on the substrate holder 328. Thus, the flow of the reaction gas has a phase difference according to a height of the substrate S. That is, a position of the supply hole 332c of the supply nozzle 332b and a position of the exhaust hole 334c of the exhaust nozzle 334b have a phase difference according to the height of the substrate S. Referring to FIG. 10, a reference numeral ① denotes a flow of a reaction gas flowing from the supply nozzle 332b toward the exhaust nozzle 334b, and a reference numeral ② denotes a flow of a reaction gas flowing from the supply nozzle 332b toward the exhaust nozzle 334b. The reference numerals ① and ② have a phase difference of a predetermined angle. Thus, the reaction gas sprayed from the supply hole may be diffused by the reaction gas sprayed from the supply hole defined at a different height. That is, the flows of the reaction gas having the phase difference may interfere with each other. Thus, the reaction gas may be moved toward the exhaust nozzle 334b in a state where the reaction gas is diffused by the interference.

Also, the supply hole 332c of the supply nozzle 332b has a circular shape. On the other hand, the exhaust hole 334c of the exhaust nozzle 334b has a slot shape. Thus, the reaction gas sprayed from the supply hole 332c of the supply nozzle 332b may be diffused to have a predetermined width according to a shape of the exhaust hole 334c (see FIG. 10). Therefore, an area on which the reaction gas contacts a surface of the substrate S may be increased. Also, the sufficient reaction may be induced to restrict the generation of the non-reaction gas. The reaction gas laminar-flows on the substrate S from the supply hole 332c up to the exhaust hole 334c.

As shown in FIG. 4, the substrate holder 328 is connected to the rotation shaft 318. The rotation shaft 318 passes through the lower chamber 312b and is connected to an elevation motor 319a and a rotation motor 319b. The rotation motor 319b is disposed on s motor housing 319c. The rotation motor 319b drives the rotation shaft 318 while the epitaxial process is performed to rotate the substrate holder 328 (and the substrates S) together with the rotation shaft 318. This is done because the reaction gas flows from the supply hole 332c toward the exhaust hole 334c, and the reaction gas is reduced in concentration as the reaction gas is deposited on the substrate S from the supply hole 332c toward the exhaust hole 334c. To prevent the above-described phenomenon from occurring, the substrate S may be rotated so that the reaction gas is uniformly deposited on the surface of the substrate S.

The motor housing 319c is fixed to a bracket 319d. The bracket 319d is connected to the elevation rod 319e connected to a lower portion of the lower chamber 312b and elevated along the elevation rod 319e. The bracket 319c is screw-coupled to a lower rod 419, and the lower rod 419 is rotated by the elevation motor 319a. That is, the lower rod 419 is rotated as the elevation motor 319a is rotated. Thus, the bracket 319d and the motor housing 319c may be elevated together. Therefore, the rotation shaft 318 and the substrate holder 328 may be elevated together. The substrate holder 328 may be moved from the stacking position into the process position by the elevation motor 319a. A bellows 318a connects the lower chamber 312b to the motor housing 319c. Thus, the inside of the lower chamber 312b may be sealed. FIG. 11 is a view illustrating a state in which the substrate holder of FIG. 1 is moved into a process position.

Referring to FIG. 11, the heat-shield plate 316 is disposed under the substrate holder 328. As the rotation shaft 318 is elevated, the substrate holder 328 is elevated together with the rotation shaft 318. The heat-shield plate 316 closes the opened lower side of the internal reaction tube 314 to prevent heat within the internal reaction tube 314 from being transmitted into the stacking space within the lower chamber 312b.

Figure 12:
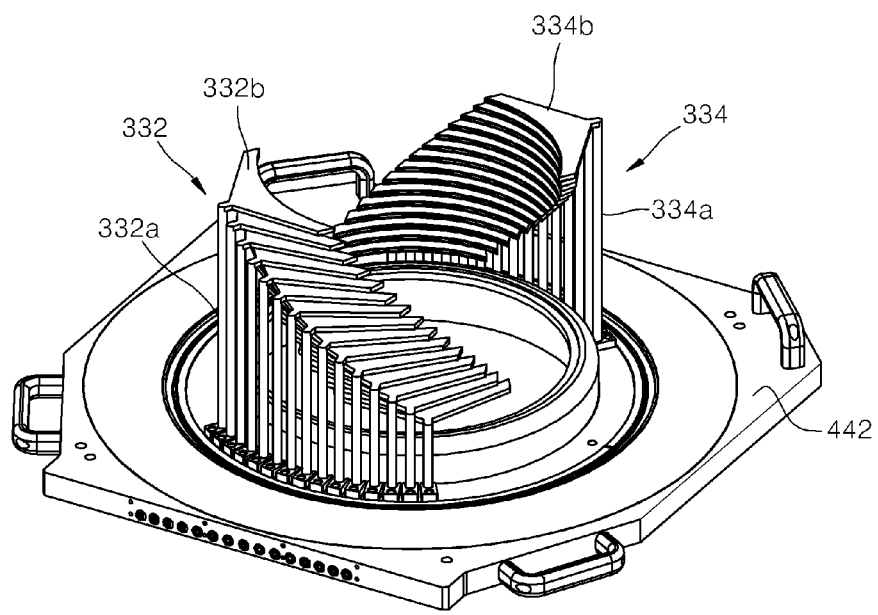
FIG. 12 is a schematic perspective view illustrating a modified example of the supply nozzles of FIG. 6.
Figure 13:
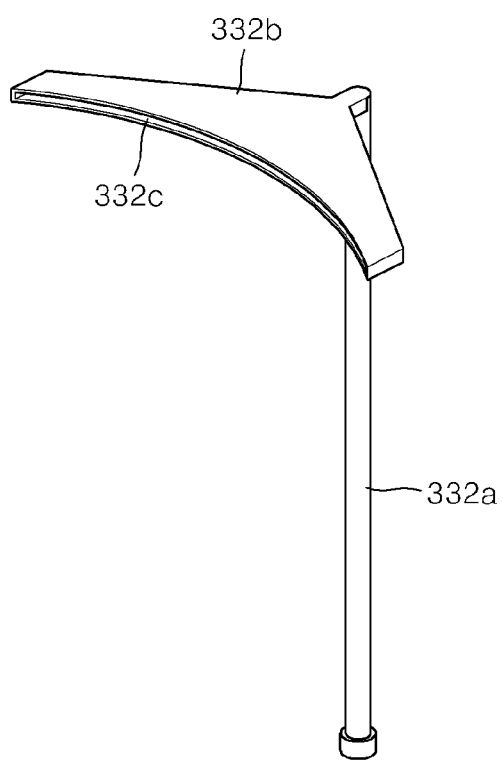
FIG. 13 is a perspective view illustrating the supply nozzle of FIG. 12.
Figure 14:
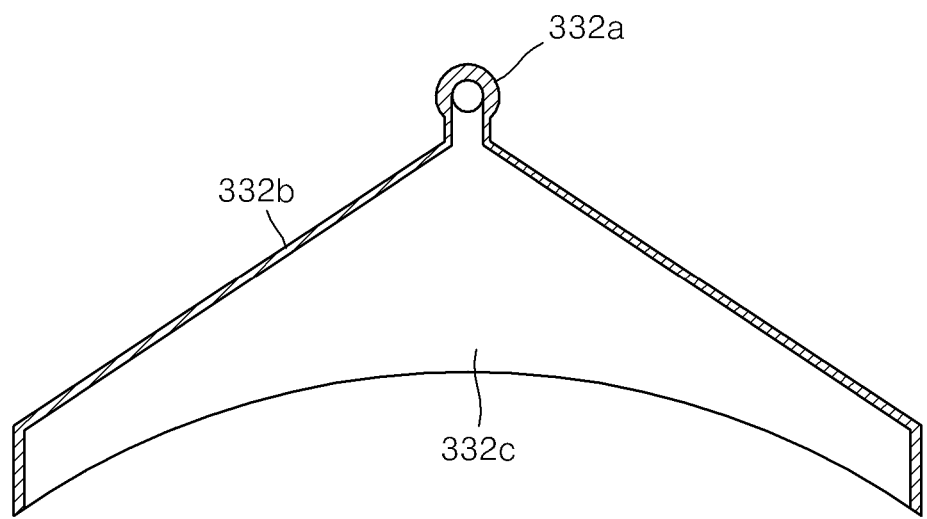
FIG. 14 is a cross-sectional view illustrating the supply nozzle of FIG. 12.

FIG. 12 is a schematic perspective view illustrating a modified example of the supply nozzles of FIG. 6. FIG. 13 is a perspective view illustrating the supply nozzles of FIG. 12. FIG. 14 is a cross-sectional view illustrating the supply nozzles of FIG. 12.

Referring to FIGS. 12 to 14, a supply nozzle 332b has an inner space with a sectional area gradually increasing in a discharge direction. A reaction gas supplied through a supply tube 332a is diffused along the inner space of the supply nozzle 332b. The supply nozzle 332b has a supply hole 332c defined in a front end thereof. The supply hole 332c has a sectional area with a slot shape. The supply hole 332c has a sectional area substantially equal to that of an exhaust hole 334c.

Figure 15:
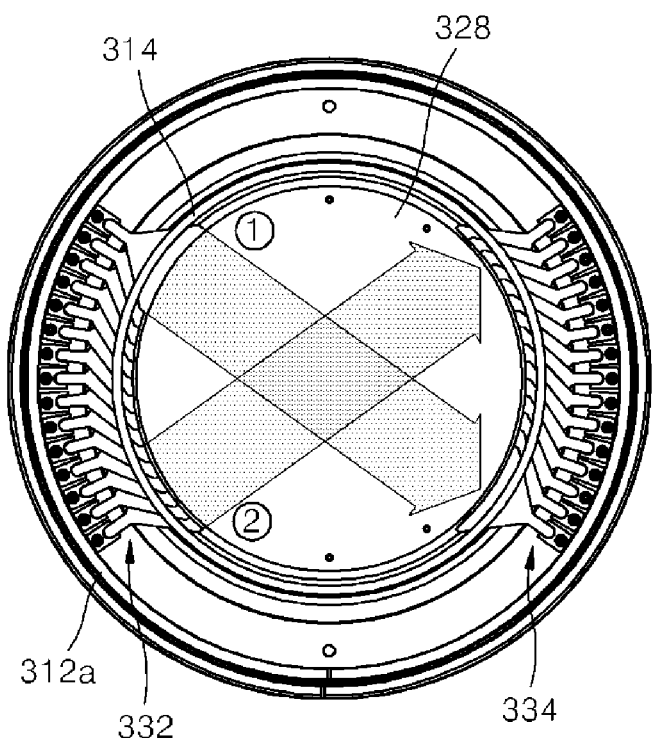
FIG. 15 is a view illustrating a flow of a reaction gas passing through the supply nozzles and the exhaust nozzles of FIG. 12.

FIG. 15 is a view illustrating a flow of a reaction gas passing through the supply nozzles and the exhaust nozzles of FIG. 12. Referring to FIG. 15, the reaction gas sprayed from the supply nozzle 332b flows toward an exhaust nozzle 334b disposed opposite to the supply nozzle 332b (indicated as an arrow). Here, since the reaction gas is discharged through the supply hole 332c in a state where the reaction gas is diffused through an inner space of the supply nozzle 332b and then is suctioned through an exhaust hole 334c of the exhaust nozzle 334b, the reaction gas forms a laminar flow having a constant width (the supply hole 332c has a sectional area substantially equal to that of the exhaust hole 334c) from the supply hole 332c up to the exhaust hole 334c.

Also, although not previously described, the exhaust nozzles 334b of FIGS. 6 and 12 may have the same structure as the supply nozzles 332b of FIGS. 12 to 14. That is, the exhaust nozzle 334b has an inner space with a sectional area gradually decreasing in a suction direction thereof. Also, the non-reaction gas and the byproducts which are suctioned through the exhaust hole 332c converge along the inner space of the exhaust nozzle 334b and then are moved into the exhaust tube 332a.

Figure 16:
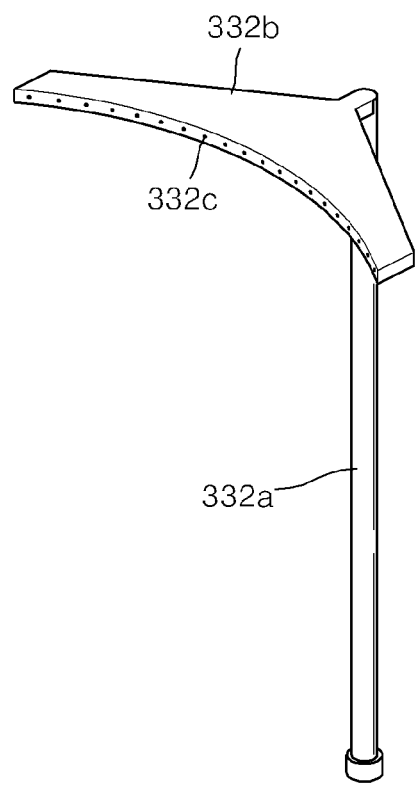
FIG. 16 is a schematic perspective view illustrating a modified example of the supply nozzle of FIG. 13.
Figure 17:
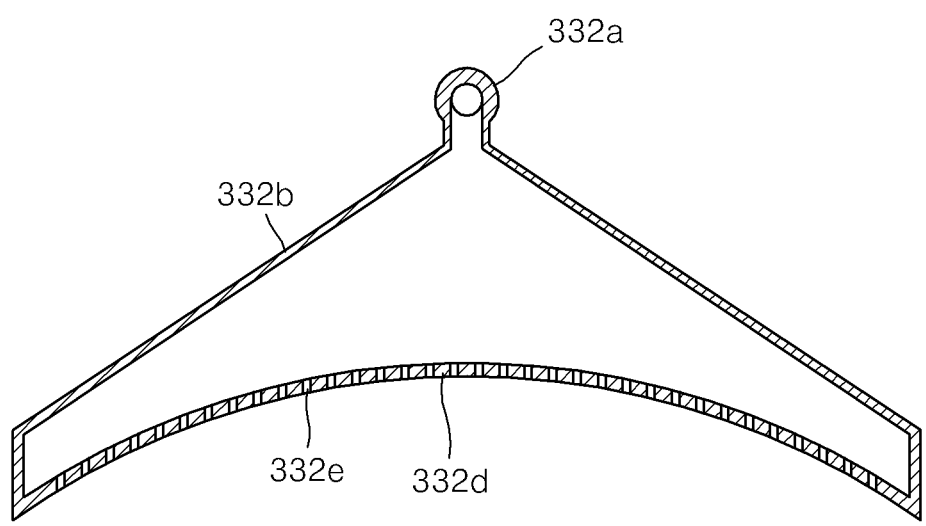
FIG. 17 is a cross-sectional view illustrating the supply nozzle of FIG. 16.

FIG. 16 is a schematic perspective view illustrating a modified example of the supply nozzles of FIG. 13. FIG. 17 is a cross-sectional view illustrating the supply nozzle of FIG. 16. Referring to FIGS. 16 and 17, a supply nozzle 332b includes an injection plate 332d. The injection plate 332d may be disposed on a supply hole 332c. The injection plate 332d has a plurality of injection holes 332e. A reaction gas diffused along an inner space of the supply nozzle 332b may be injected through the injection holes 332e.

According to the embodiments, the reaction gas may uniformly flow within the process space. Specifically, the reaction gas having the phase difference may flow. Also, the reaction gas may be concentrated onto the substrate.

Although the present invention is described in detail with reference to the exemplary embodiments, the invention may be embodied in many different forms. Thus, technical idea and scope of claims set forth below are not limited to the preferred embodiments.

What is claimed is:

1. A substrate processing apparatus in which processes with respect to substrates are performed, the substrate processing apparatus comprising:
    a lower chamber having an opened upper side, the lower chamber comprising a passage allowing the substrates to pass therethrough in a side thereof;
    an external reaction tube closing the opened upper side of the lower chamber to provide a process space in which the processes are performed;
    a substrate holder on which the substrates are vertically stacked, the substrate holder being movable between a stacking position in which the substrates are stacked and a process position in which the processes with respect to the substrates are performed; and
    a gas supply unit disposed inside the external reaction tube to supply a reaction gas into the process space,
    wherein the gas supply unit comprises:
    a plurality of supply nozzles disposed along an inner wall of the external reaction tube, the plurality of supply nozzles having a plurality of supply holes for discharging the reaction gas; and
    a plurality of exhaust nozzles disposed along the inner wall of the external reaction tube, the plurality of exhaust nozzles having a plurality of exhaust holes for suctioning an non-reaction gas and byproducts within the process space,
    wherein the plurality of supply holes are disposed in an inner wall of the external reaction tube to have a phase difference in a circumference direction of the external reaction tube from each other and to be located at a different height from each other,
    wherein the plurality of exhaust holes are disposed in the inner wall of the external reaction tube to have a phase difference in a circumference direction of the external reaction tube from each other and to be located at a different height from each other,
    wherein each of the supply holes is disposed at a same height as a corresponding one of the exhaust holes, and a center of each of the supply holes is symmetric to a center of the corresponding one of the exhaust holes with respect to a center of the external reaction tube, and
    wherein the gas supply unit forms a flow of the reaction gas to have a phase difference in a vertical direction.

2. The substrate processing apparatus of claim 1, wherein the gas supply unit comprises:
    a plurality of supply tubes respectively connected to the plurality of supply nozzles to supply the reaction gas into each of the supply nozzles; and
    a plurality of exhaust tubes respectively connected to the plurality of exhaust nozzles to allow the non-reaction gas and the byproducts suctioned through each of the exhaust nozzles to pass therethrough.

3. The substrate processing apparatus of claim 1, wherein the supply nozzles and the exhaust nozzles are disposed to respectively correspond to the substrates stacked on the substrate holder when the substrate holder is disposed at the process position.

4. The substrate processing apparatus of claim 1, wherein each of the supply nozzles is a circular tube having the supply hole through which the reaction gas is discharged, the supply hole having a circular sectional area,
    each of the exhaust nozzles has an inner space with a section area gradually decreasing in a suction direction thereof and an exhaust hole defined in a front end thereof and having a slot-shaped sectional area.

5. The substrate processing apparatus of claim 1, wherein each of the supply nozzles has an inner space with a sectional area gradually increasing in a discharge direction thereof, the supply hole being defined in a front end thereof and having a slot-shaped sectional area,
    each of the exhaust nozzles has an inner space with a sectional area gradually decreasing a suction direction thereof and an exhaust hole defined in a front end thereof and having a slot-shaped sectional area.

6. The substrate processing apparatus of claim 1, wherein each of the supply nozzles has an inner space with a sectional area gradually increasing in a discharge direction thereof, the supply hole being defined in a front end thereof and having a slot-shaped sectional area, and an injection plate disposed on the supply hole and having a plurality of injection holes,
    each of the exhaust nozzles has an inner space with a sectional area gradually decreasing a suction direction thereof and an exhaust hole defined in a front end thereof and having a slot-shaped sectional area.

7. The substrate processing apparatus of claim 1, wherein the gas supply unit further comprises a plurality of supply lines respectively connected to the supply nozzles to supply the reaction gas into each of the supply nozzles.

8. The substrate processing apparatus of claim 7, further comprising a support flange disposed between the lower chamber and the external reaction tube,
wherein the supply lines are connected to the supply nozzles through the support flange, respectively.

9. The substrate processing apparatus of claim 1, further comprising an internal reaction tube disposed inside the external reaction tube, the internal reaction tube being disposed around the substrate holder to divide a reaction region with respect to the substrates, and the supply holes and the exhaust holes are disposed in the internal reaction tube.

10. The substrate processing apparatus of claim 1, further comprising thermocouples vertically disposed inside the external reaction tube.

11. The substrate processing apparatus of claim 1, further comprising a rotation shaft connected to the substrate holder, the rotation shaft being rotated in a preset direction during the processes.

* * * * *